United States Patent
Sugamoto

(10) Patent No.: US 10,992,244 B2
(45) Date of Patent: Apr. 27, 2021

(54) LOAD DRIVING CIRCUIT

(71) Applicant: ROHM CO., LTD., Kyoto (JP)

(72) Inventor: Hiroki Sugamoto, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 16/580,303

(22) Filed: Sep. 24, 2019

(65) Prior Publication Data

US 2020/0021215 A1 Jan. 16, 2020

Related U.S. Application Data

(63) Continuation of application No. PCT/JP2018/011851, filed on Mar. 23, 2018.

(30) Foreign Application Priority Data

Mar. 24, 2017 (JP) ............................. JP2017-059452
Mar. 22, 2018 (JP) ............................. JP2018-054900

(51) Int. Cl.
*H02P 29/024* (2016.01)
*H02P 7/288* (2016.01)
*H03K 17/56* (2006.01)

(52) U.S. Cl.
CPC ............ *H02P 7/288* (2013.01); *H03K 17/56* (2013.01)

(58) Field of Classification Search
CPC ...... H02P 7/288; H02P 29/0241; H03K 17/56
See application file for complete search history.

(56) References Cited

U.S. PATENT DOCUMENTS

| 8,975,844 B2 | 3/2015 | Lee | |
| 2016/0013742 A1* | 1/2016 | Gohara | ............... H02P 29/0241 |
| | | | 318/461 |
| 2016/0118916 A1* | 4/2016 | Gohara | ..................... H02P 6/17 |
| | | | 318/400.13 |

FOREIGN PATENT DOCUMENTS

| JP | H0614587 A | 1/1994 |
| JP | 2008263733 A | 10/2008 |
| JP | 2012065470 A | 3/2012 |
| TW | 107110149 B | 1/2014 |

OTHER PUBLICATIONS

International Search Report corresponding to Application No. PCT/JP2018/011851; dated Jun. 19, 2018.
IPRP corresponding to Application No. PCT/JP2018/011851; dated Sep. 24, 2019.
Taiwanese Office Action corresponding to Application No. 10721065980; dated Nov. 16, 2018.

* cited by examiner

*Primary Examiner* — Cortez M Cook
(74) *Attorney, Agent, or Firm* — Cantor Colburn LLP

(57) ABSTRACT

Two control input pins INA and INB receive two control input signals from an external circuit. A logic circuit generates an internal signal $S_{INT}$ for indicating the state of an H-bridge circuit according to the two control input signals INA and INB. A pre-driver drives the H-bridge circuit based on the internal signal $S_{INT}$. When the two control input signals INA and INB continue in a predetermined state for a predetermined judgment period of time, a standby circuit switches a driving circuit to a standby mode.

9 Claims, 14 Drawing Sheets

FIG. 3

|  | INPUT | | OUTPUT | | INTERNAL STATE | | | |
|---|---|---|---|---|---|---|---|---|
|  | INA | INB | OUTA | OUTB | M1 | M2 | M3 | M4 |
| $\phi_1$ | L | L | Z | Z | OFF | OFF | OFF | OFF |
| $\phi_2$ | H | L | H | L | ON | OFF | OFF | ON |
| $\phi_3$ | L | H | L | H | OFF | ON | ON | OFF |
| $\phi_4$ | H | H | L | L | OFF | ON | OFF | ON |

FIG. 7A

|  | INPUT | OUTPUT | | INTERNAL STATE | | | |
|---|---|---|---|---|---|---|---|
|  | IN | OUTA1 | OUTA2 | M1 | M2 | M3 | M4 |
| $\phi_1$ | L | L | H | OFF | ON | ON | OFF |
| $\phi_2$ | H | H | L | ON | OFF | OFF | ON |
| $\phi_S$ | CONTINUOUS L | L | L | OFF | ON | OFF | ON |

FIG. 7B

|  | INPUT | OUTPUT | | INTERNAL STATE | | | |
|---|---|---|---|---|---|---|---|
|  | IN | OUTA1 | OUTA2 | M1 | M2 | M3 | M4 |
| $\phi_1$ | L | L | H | OFF | ON | ON | OFF |
| $\phi_2$ | H | H | L | ON | OFF | OFF | ON |
| $\phi_S$ | CONTINUOUS L | H | H | ON | OFF | ON | OFF |

FIG. 7C

|  | INPUT | OUTPUT | | INTERNAL STATE | | | |
|---|---|---|---|---|---|---|---|
|  | IN | OUTA1 | OUTA2 | M1 | M2 | M3 | M4 |
| $\phi_1$ | L | L | H | OFF | ON | ON | OFF |
| $\phi_2$ | H | H | L | ON | OFF | OFF | ON |
| $\phi_S$ | CONTINUOUS L | Z | Z | OFF | OFF | OFF | OFF |

# LOAD DRIVING CIRCUIT

CROSS REFERENCE TO RELATED APPLICATION

This application is a bypass continuation under 35 U.S.C. § 120 of PCT/JP2018/011851, filed Mar. 23, 2018, which is incorporated herein reference and which claimed priority to Japanese Patent Application No. 2017-059452, filed Mar. 24, 2017. The present application also claims priority under 35 U.S.C. § 119 to Japanese Patent Application No. 2018-054900, filed Mar. 22, 2018, the entire content of which is also incorporated herein by reference.

BACKGROUND OF THE INVENTION

1. Field of the Invention

The present invention relates to a driving circuit that drives a load such as a motor or the like.

2. Description of the Related Art

FIG. 1 is a block diagram showing a driving circuit for a DC motor. A driving circuit 100R includes a logic circuit 110, a pre-driver 120, and an H-bridge circuit 130. A motor 202 to be driven is coupled to output terminals (pins) OUTA and OUTB of the driving circuit 100R. The driving circuit 100R receives a control instruction $S_1$ from an external controller 204, and drives the motor 202 according to the control instruction $S_1$.

With the driving circuit 100R, the control instruction $S_1$ is not configured as a torque instruction, speed instruction, position instruction, or the like. Instead, the control instruction $S_1$ includes data that indicates the state of the H-bridge circuit 130.

The H-bridge circuit 130 can be set to one from among four states $\phi_1$ through $\phi_4$. Here, "H" represents high voltage, "L" represents low voltage, and "Z" represents a high-impedance state.

$\phi_1$ OUTA=Z, OUTB=Z
$\phi_2$ OUTA=H, OUTB=L
$\phi_3$ OUTA=L, OUTB=H
$\phi_4$ OUTA=L, OUTB=L Here, $\phi_4$ represents a short brake state, which may be provided by a state in which OUTA=H and OUTB=H.

For example, the driving circuit 100R includes, in addition to the two output pins OUTA and OUTB, a power supply pin VM for the H-bridge circuit 130, a ground pin PGND, a power supply pin VCC for the upstream-stage circuits 110 and 120, and a ground pin GND. In a case in which the driving circuit 100R is to be housed in a package having eight pins, two control pins INA and INB may be assigned in order to receive the control instruction $S_{CNT}$ from the controller 204. In a case in which each control pin can be controlled such that it is switched between two states, i.e., a high state and a low state, the state can be switched between the four states, i.e., the states $\phi_1$ through $\phi_4$ using the two control pins INA and INB.

In many cases, ICs (Integrated Circuits) support a standby mode in order to provide low power consumption. Typical ICs are provided with an enable pin. Such an IC is configured such that, by setting the enable pin to a predetermined state, the operation mode is set to the standby mode.

However, an application in which a compact size of such an IC is prioritized involves difficulty in increasing the number of pins provided to the package. This leads to a problem in that the standby mode cannot be implemented.

SUMMARY OF THE INVENTION

The present invention has been made in order to solve such a problem. Accordingly, it is an exemplary purpose of an embodiment of the present invention to provide a driving circuit that can be set to a standby mode without a need to increase the number of pins.

An embodiment of the present invention relates to a driving circuit structured to drive a load. The driving circuit comprises: a bridge circuit including transistors; one or two control input pins to be coupled to receive one or two control input signals indicative of a state of the bridge circuit from an external circuit; a logic circuit structured to generate an internal signal indicative of a state of the transistors of the bridge circuit according to the one or two control input signals; and a pre-driver structured to drive the H-bridge circuit according to the internal signal. The driving circuit is structured to be switched to a standby mode when the one or two control input signals continue in a predetermined state for a predetermined judgment period of time.

With this embodiment, such an arrangement is capable of switching multiple states of the bridge circuit and the standby mode using one or two control input pins.

Also, the predetermined state may correspond to a high-impedance state of the bridge circuit.

Also, the predetermined state may correspond to a short brake state of the bridge circuit.

Also, the judgment period of time may be longer than 50 µs. In a case in which the PWM driving is performed using this driving circuit, the state of the control input pin changes with a PWM period. Alternatively, in a case in which a stepping motor is driven, the state of the control input pin changes with a frequency (period) of a control pulse that defines the rotational speed. In order to suppress audible-band noise, the PWM frequency or the control pulse frequency (i.e., the frequency with which the state of the control input pin changes) is set to a frequency outside the audio-band frequency, i.e., 20 kHz or more. Accordingly, by setting the judgment period of time to be longer than 50 µs, this arrangement is capable of distinguishing between an intended transition instruction to the standby state and a particular state in the PWM driving or in the control of a stepping motor.

Another embodiment of the present invention relates to a control method for a driving circuit comprising a bridge circuit to be coupled to a motor. The control method comprises: switching one or two control input signals for setting a state of the bridge circuit, with an interval that is shorter than a predetermined period, in order to rotationally drive the motor; controlling the bridge circuit according to the one or two control input signals; fixedly setting, by the processor, the one or two control input signals for a predetermined period of time in order to switch the driving circuit to a standby mode; and switching the driving circuit to the standby mode when the driving circuit detects that the one or two control input signals continue in the predetermined state for the predetermined period of time.

It is to be noted that any arbitrary combination or rearrangement of the above-described structural components and so forth is effective as and encompassed by the present embodiments. Moreover, this summary of the invention does not necessarily describe all necessary features so that the invention may also be a sub-combination of these described features.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which:

FIG. 3 is a diagram showing an example of the correspondence between the states of control input pins INA and INB of the driving circuit shown in FIG. 2 and an internal state and an output state of the driving circuit;

FIG. 7A through FIG. 7C are diagrams showing several examples of the correspondence between the states of the control input pins IN of the driving circuit shown in FIG. 6 and the internal state and the output state of the driving circuit;

DETAILED DESCRIPTION OF THE INVENTION

The invention will now be described based on preferred embodiments which do not intend to limit the scope of the present invention but exemplify the invention. All of the features and the combinations thereof described in the embodiment are not necessarily essential to the invention.

In the present specification, the state represented by the phrase "the member A is coupled to the member B" includes a state in which the member A is indirectly coupled to the member B via another member that does not substantially affect the electric connection between them, or that does not damage the functions or effects of the connection between them, in addition to a state in which they are physically and directly coupled.

Similarly, the state represented by the phrase "the member C is provided between the member A and the member B" includes a state in which the member A is indirectly coupled to the member C, or the member B is indirectly coupled to the member C via another member that does not substantially affect the electric connection between them, or that does not damage the functions or effects of the connection between them, in addition to a state in which they are directly coupled.

First Example

Figure 1:
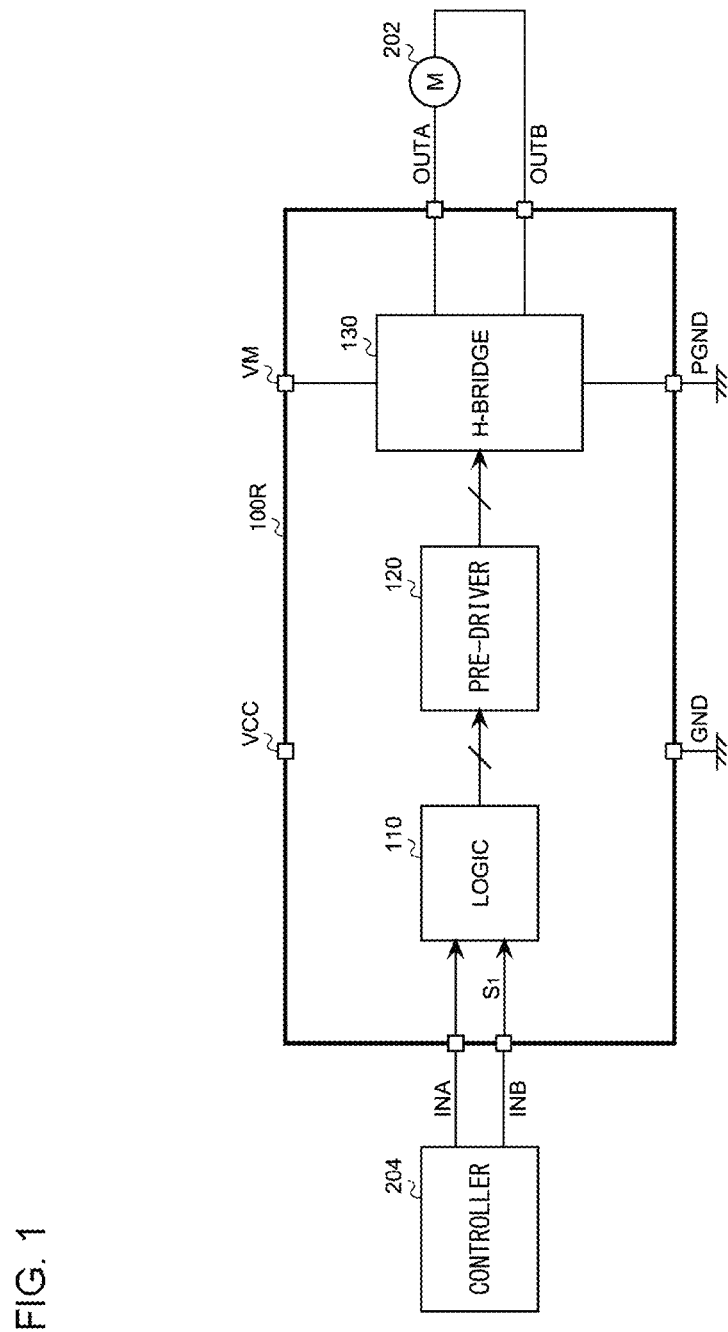
FIG. 1 is a block diagram showing a driving circuit for a DC motor.
Figure 2:
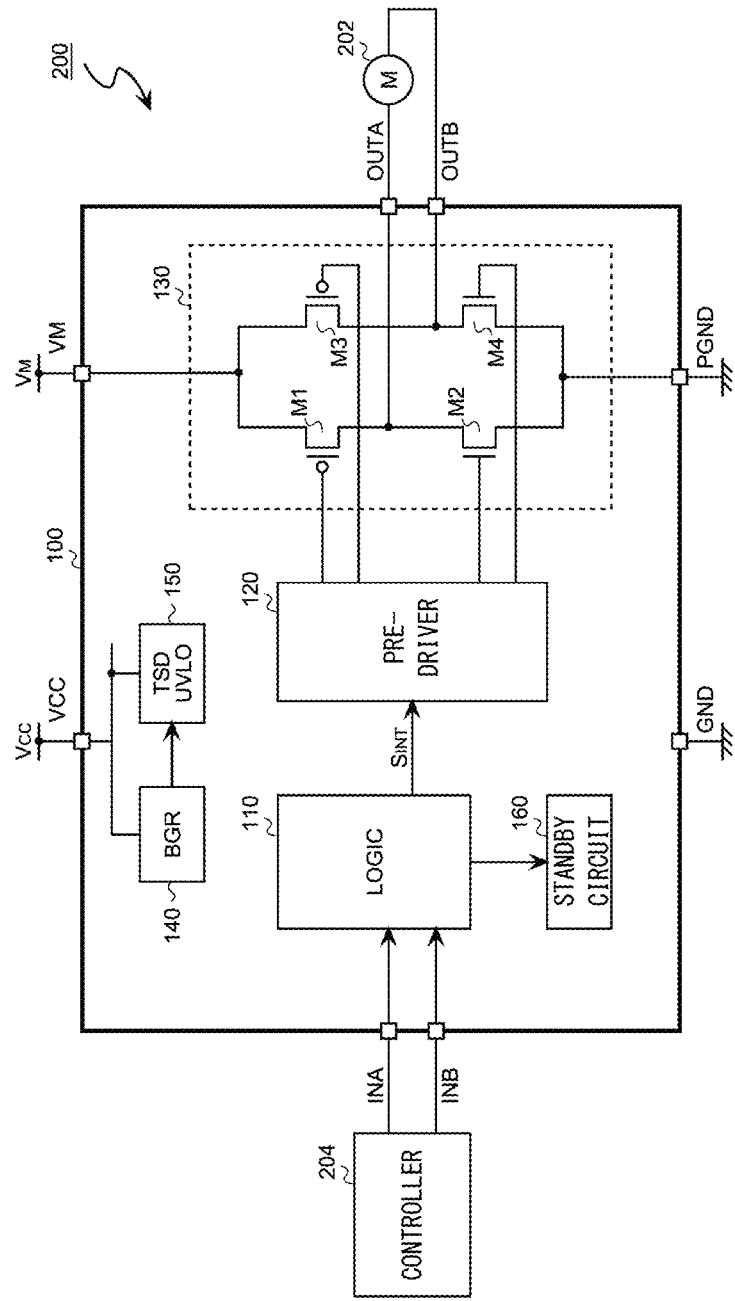
FIG. 2 is a circuit diagram showing a system including a driving circuit according to a first example.

FIG. 2 is a circuit diagram showing a system 200 including a driving circuit 100 according to a first example. The driving circuit 100 includes two control input pins INA and INB. Two control input signals are supplied from an external controller 204 to the two control input pins INA and INB, respectively. The driving circuit 100 drives a load (e.g., a motor 202) coupled to the two output terminals OUTA and OUTB.

The driving circuit 100 includes a logic circuit 110, a pre-driver 120, an H-bridge circuit 130, a BGR (bandgap reference) circuit 140, a protection circuit 150, and a standby circuit 160, which are housed in a single package. The driving circuit 100 may be configured as a function IC integrated on a single semiconductor substrate. Alternatively, the H-bridge circuit 130 may be integrated on a different chip from that on which the other blocks (110, 120, 140, 150, and 160) are integrated.

The H-bridge circuit 130 can be set to one from among four states $\phi_1$ through $\phi_4$ according to the control input pins INA and INB.

$\phi_1$ OUTA=Z, OUTB=Z
$\phi_2$ OUTA=H, OUTB=L
$\phi_3$ OUTA=L, OUTB=H
$\phi_4$ OUTA=L, OUTB=L The logic circuit 110 monitors the states (control input signals) of the control pins INA and INB so as to judge which state is set from among the states $\phi_1$ through $\phi_4$. Furthermore, the logic circuit 110 generates an internal signal SNT according to the state thus judged. The internal signal $S_{INT}$ may be configured as a signal for indicating the on/off states of four transistors M1 through M4 that form the H-bridge circuit 130. The pre-driver 120 controls the gate voltages of the transistor M1 through M4 of the H-bridge circuit 130 based on the internal signal $S_{INT}$.

The BGR circuit 140 generate a reference voltage. The protection circuit 150 includes a thermal shutdown (TSD) circuit, an under-voltage lockout (UVLO) circuit, or the like. The protection circuit 150 is configured including a voltage comparator.

When the two control input signals INA and INB continue in a predetermined state $\phi$ for a predetermined judgment period of time τ, the standby circuit 160 switches the driving circuit 100 to the standby mode. In the standby mode, the supply of bias current, the supply of bias voltage, and the supply of power supply voltage are suspended for circuit blocks except for the logic circuit 110. In the standby mode, the current consumption of the driving circuit 100 is lowered to a level on the order of several μA. It should be noted that FIG. 2 shows an example in which the standby circuit 160 is configured as a circuit external to the logic circuit 110. However, in actuality, the function of the standby circuit 160 may be supported as a part of the logic circuit 110.

FIG. 3 is a diagram showing an example of the correspondence between the states of the control input pins INA and INB and the internal state and the output state of the driving circuit 100.

In the first example, as the predetermined state $\phi$, the high-impedance state $\phi_1$ of the H-bridge circuit 130 is employed. Returning to FIG. 2, the standby circuit 160 measures the period of time for which the logic circuit 110 has detected the high-impedance state $\phi_1$. When the period of time reaches a judgment period of time τ, the standby circuit 160 switches the driving circuit 100 to the standby mode. The judgment period of time τ is preferably set to a period that is longer than 50 μs. For example, the judgment period of time τ is set to a period from 50 to 500 μs.

Figure 4:
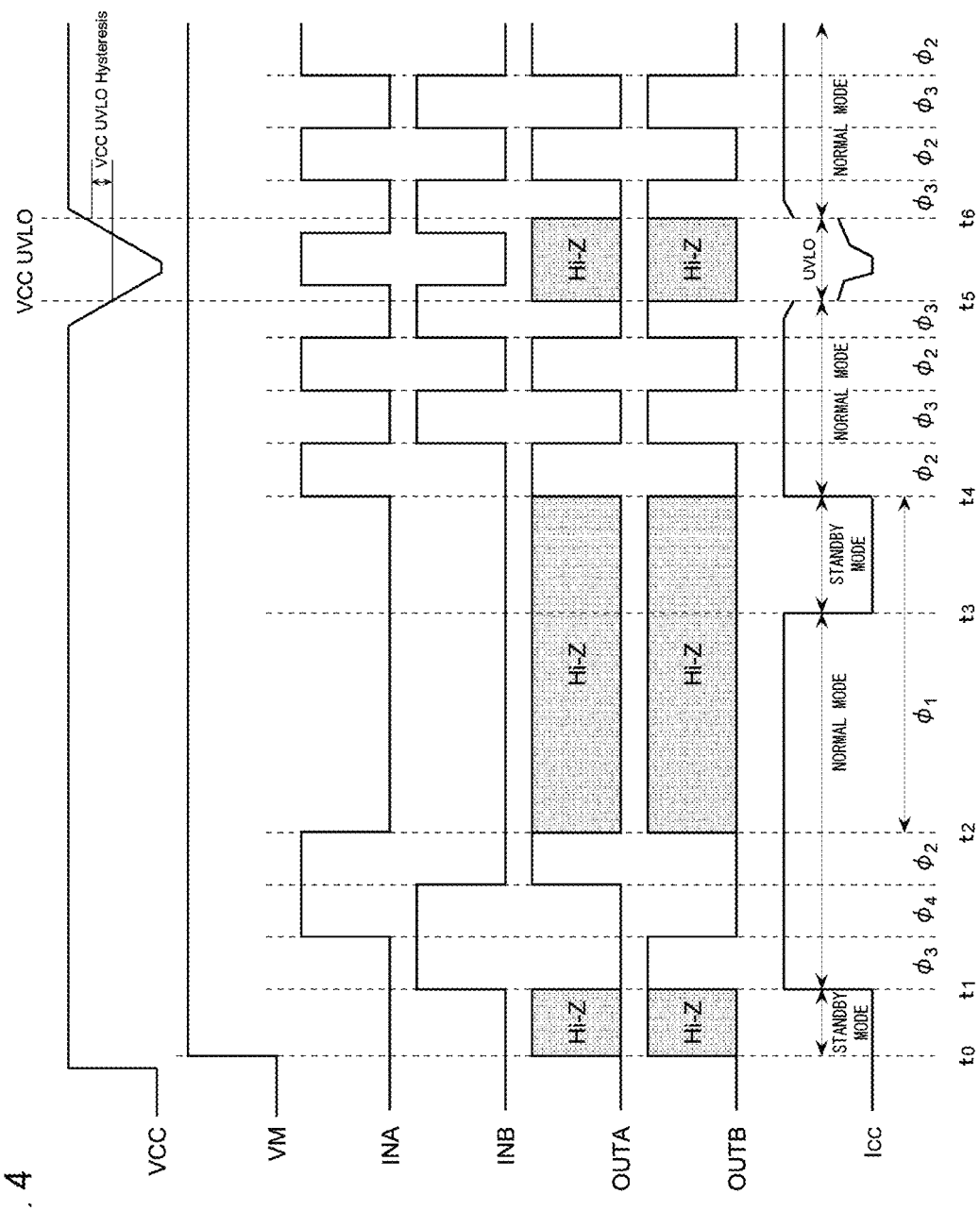
FIG. 4 is an operation waveform diagram of the driving circuit shown in FIG. 2.

The above is the configuration of the driving circuit 100. Next, description will be made regarding the operation thereof. FIG. 4 is an operation waveform diagram showing the operation of the driving circuit 100 shown in FIG. 2. At the time point to, the power supply voltages $V_{CC}$ and $V_M$ are turned on. Immediately after startup, the operation mode is set to the standby mode. In this state, the operation current $I_{CC}$ is very small.

When the control input signals INA and INB are switched at the time point $t_1$, the operation mode is switched to the normal mode. In the normal mode, the operation state is switched in order of $\phi_3$, $\phi_4$, and $\phi_2$, according to the levels of the control input signals INA and INB. When the operation state is set to the state $\phi_1$ at the time point $t_2$, the output is set to the high-impedance state. When the operation state $\phi_4$ continues for the judgment period of time τ at the time point $t_3$, the operation mode is switched to the standby mode. In this mode, the operation current $I_{CC}$ is lowered.

When the control input signals INA and INB are switched at the time point $t_4$, the operation mode is switched to the normal mode. In the normal mode, the operation state is switched in order of $\phi_2$, $\phi_3$, $\phi_2$, and $\phi_3$, according to the levels of the control input signals INA and INB. When the power supply voltage $V_{CC}$ becomes lower than a threshold value set for the UVLO circuit at the time point $t_5$, an under-voltage lockout state occurs. In this state, the output of the H-bridge circuit 130 is set to the high-impedance state.

When the power supply voltage $V_{CC}$ exceeds the threshold set for the UVLO circuit, the under-voltage lockout state is released. Subsequently, the state of the H-bridge circuit 130 is switched according to the control input signals INA and INB.

The above is the operation of the driving circuit 100. With the driving circuit 100, this arrangement allows the four states of the H-bridge circuit 130 to be externally controlled, and the operation mode to be switched to the standby mode, using only the two control input pins INA and INB without a need for an additional enable pin.

In a case in which the driving circuit employs the control input configured as a torque instruction or a speed instruction, the control signal can explicitly indicate the suspension of the motor. For example, when the torque instruction (speed instruction) is set to zero, the torque signal can be regarded as an instruction to suspend the motor. Accordingly, after a standby period of time that is required to completely set the motor to the stationary state elapses after the torque instruction (speed instruction) is set to zero, the operation mode may be preferably set to the standby mode.

In contrast, in a case as with the driving circuit 100 according to the present example, i.e., in a case in which the driving circuit is configured to receive the control input signals INA and INB that indicate the state of the H-bridge circuit 130, there is no explicit suspension instruction. With such an application employing the PWM driving operation, the high-impedance state repeatedly occurs. Accordingly, the occurrence of the high-impedance state does not necessarily indicate the suspension instruction. The same can be said of the control of a stepping motor.

Typically, the PWM driving of a DC motor or the driving of a stepping motor is executed using a frequency outside the audible band. Accordingly, by setting the judgment period of time τ to be longer than a pulse period (up to 50 μs), this arrangement is capable of distinguishing the switching instruction to the standby mode from the high-impedance state that occurs in the PWM driving of a DC motor or the driving of a stepping motor. This is because the driving circuit 100 supports a pulse driving operation with a period that is shorter than the judgment period of time τ.

With the system 200, by alternately switching the state between $\phi_1$ and $\phi_4$ by the controller 204 with a period that is shorter than the judgment period of time τ, this arrangement is capable of maintaining the normal mode in the stationary state of the motor 202 without switching the driving circuit 100 to the standby mode. Such control cannot be supported by a driving circuit configured to receive a torque instruction or a speed instruction.

The standby mode involves suspension of the bias circuit or the like. This requires a period of time of several μs to return the operation mode to the normal mode. However, in some cases, the PWM driving operation is required to change the output voltage of the H-bridge circuit with a through rate of several dozen ns. In a case of employing a control operation in which, upon detecting the high-impedance control input, the operation mode is immediately switched to the standby mode, this involves large distortion in the waveform of the H-bridge circuit in the PWM control. This restricts the kinds of applications that can be used. With the embodiment, such an arrangement does not involve the occurrence of distortion in the waveform of the output voltage of the H-bridge circuit. Accordingly, the embodiment is applicable to various kinds of applications.

Second Example

Figure 5:
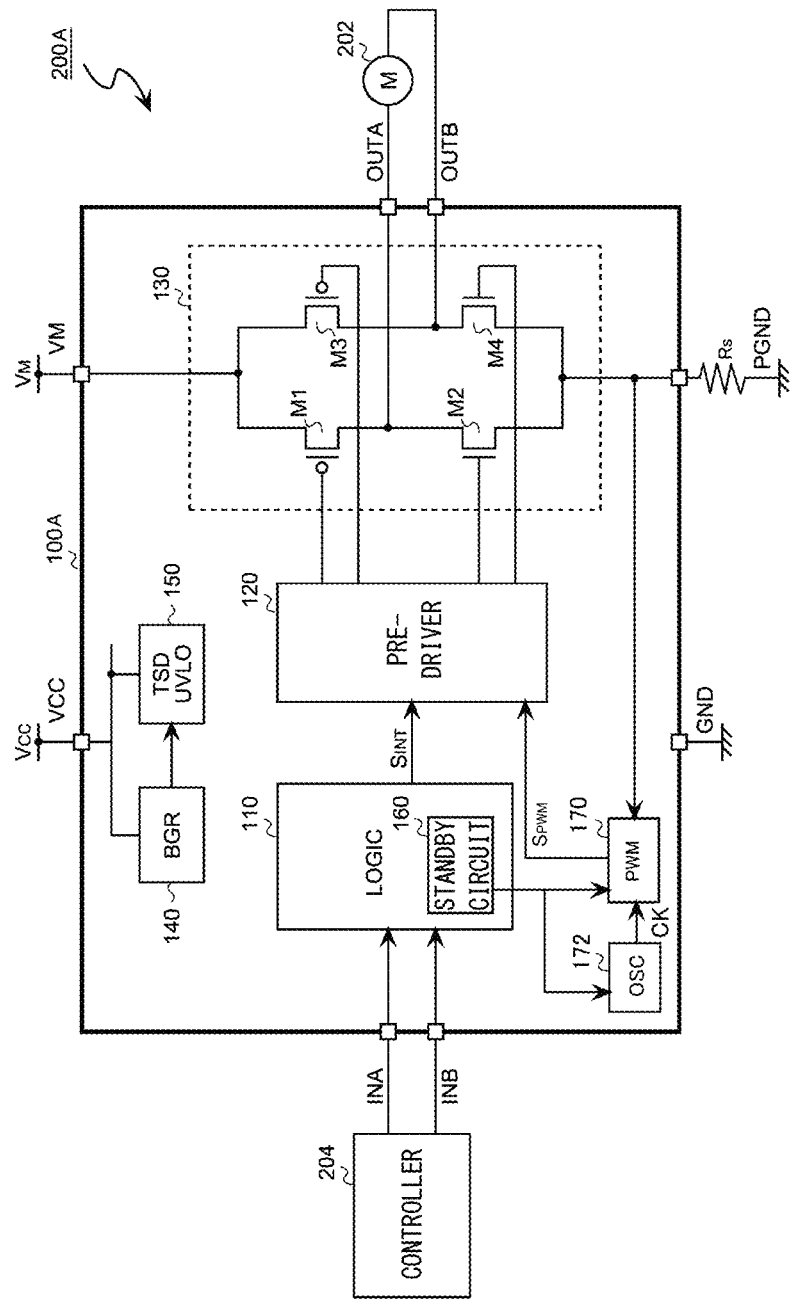
FIG. 5 is a circuit diagram showing a system including a driving circuit according to a second example.

FIG. 5 is a circuit diagram showing a system 200A including a driving circuit 100A according to a second example. The driving circuit 100A includes a PWM (Pulse Width Modulation) circuit 170 configured to switch on and off a driving signal. A shunt resistor Rs is provided on a path of a driving current, and specifically, between a PGND pin and an external ground. A voltage drop (current detection signal) Vs occurs across the shunt resistor Rs according to the driving current that flows through the motor 202. The shunt resistor Rs may be built into the driving circuit 100A.

The PWM circuit 170 is configured as a pulse-by-pulse current limiting circuit. The PWM circuit 170 generates a PWM signal $S_{PWM}$ based on the current detection signal Vs. The PWM circuit 170 operates in synchronization with a clock generated by an oscillator 172. For example, the PWM circuit 170 switches the PWM signal $S_{PWM}$ to a first level (e.g., high level) in response to a positive edge of the clock CK generated by the oscillator 172. Furthermore, the PWM circuit 170 compares the current detection signal Vs with a limit value $V_{CL}$ that defines the upper limit of the driving current. Upon detecting Vs>$V_{CL}$, i.e., when the driving current reaches the limit value, the PWM circuit 170 switches the PWM signal $S_{PWM}$ to a second level (e.g., low level).

The PWM signal $S_{PWM}$ is supplied to the pre-driver 120. The pre-driver 120 logically combines the PWM signal $S_{PWM}$ and the internal signal $S_{INT}$, so as to control the H-bridge circuit 130. The function of the logical combining may be implemented in the logic circuit 110.

In the standby state, the standby circuit 160 may suspend the PWM circuit 170. Specifically, by disconnecting the current that flows through a comparator included in the PWM circuit 170, this arrangement is capable of reducing the current consumption. Also, in the standby state, this arrangement may suspend the oscillator 172 that generates the clock CK. This allows the current consumption to be further reduced.

Third Example

Figure 6:
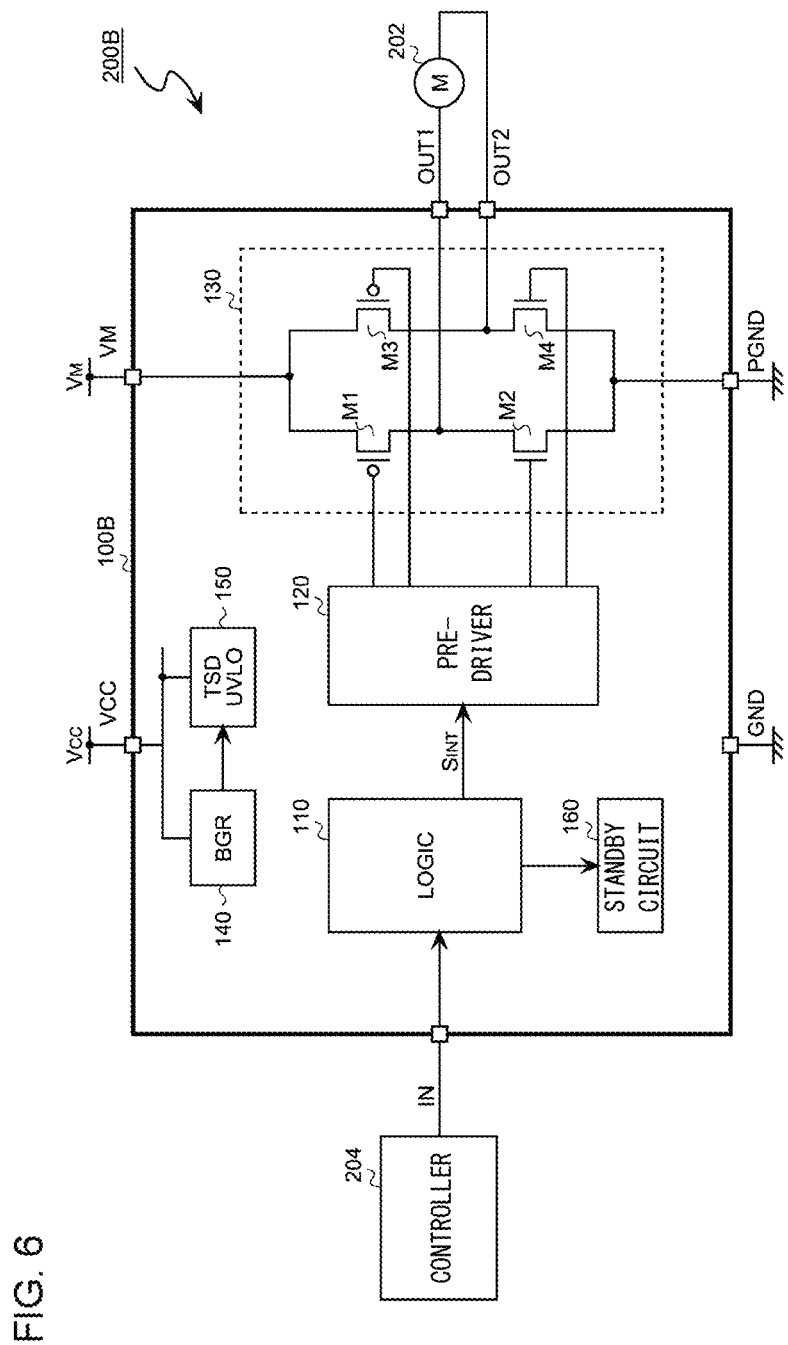
FIG. 6 is a circuit diagram showing a system including a driving circuit according to a third example.

FIG. 6 is a circuit diagram showing a system 200B including a driving circuit 100B according to a third example. The driving circuit 100B includes a single control pin IN. The control pin receives the input of a control input signal IN configured as a high/low binary signal. The logic circuit 110 switches the state of the bridge circuit 130 in response to transition of the state of the control input pin IN. Furthermore, when the control input pin IN continues in a predetermined state for a predetermined period of time, the standby circuit 160 switches the driving circuit 100B to the standby state.

FIG. 7A through FIG. 7C are diagrams showing several examples of the correspondence between the state of the control input pin IN of the driving circuit 100B shown in FIG. 6 and the internal state and the output state of the driving circuit 100B. This arrangement allows the H-bridge circuit 130 to be switched between the following two states $\phi_1$ and $\phi_2$.
$\phi_1$ OUT1=L, OUT2=H
$\phi_2$ OUT1=H, OUT2=L The logic circuit 110 monitors the state (control input signal) of the control input pin IN, so as to judge which state is set from among the two states $\phi_1$ and $\phi_2$. The logic circuit 110 generates the internal signal $S_{INT}$ according to the state thus judged.

Furthermore, when the first state $\phi_1$ (i.e., the low state of the IN pin) continues for a predetermined period of time, the standby circuit 160 switches the driving circuit 100B to the standby mode. In the standby mode, the logic circuit 110 switches the internal signal $S_{INT}$ so as to set the H-bridge circuit 130 to a particular state $\phi$s (short brake state) that differs from the first state $\phi_1$ and the second state $\phi_2$. In the standby mode, this allows the motor 202 to be fixed to the stationary state.

In an example shown in FIG. 7A, the state $\phi$s is configured as a short brake state in which the outputs are fixed to the low level (OUT1=L, OUT2=L). In this state, the transistors M2 and M4 are each turned on. The transistors M1 and M3 are each turned off.

In an example shown in FIG. 7B, the state $\phi$s is configured as a short brake state in which the outputs are fixed to the high level (OUT1=H, OUT2=H). In this state, the transistors M2 and M4 are each turned off. The transistors M1 and M3 are each turned on.

In an example shown in FIG. 7C, the state $\phi$s is configured as a high-impedance state in which OUT1=Z and OUT2=Z. In this state, the transistors M1 through M4 are each turned off.

In the examples shown in FIG. 7A through FIG. 7C, a condition that the second state $\phi_2$ (IN=H) continues for a predetermined period of time may be employed as a condition for switching to the standby mode.

The state $\phi$s to be set in the standby mode may be designed to be selectable. That is to say, when either one of the first state $\phi_1$ or the second state $\phi_2$ continues for a predetermined period of time, the state $\phi$s may be set to the short brake state. On the other hand, when the other of the first state $\phi_1$ or the second state $\phi_2$ continues for a predetermined period of time, the state $\phi$s may be set to the high-impedance state.

Fourth Example

Figure 8:
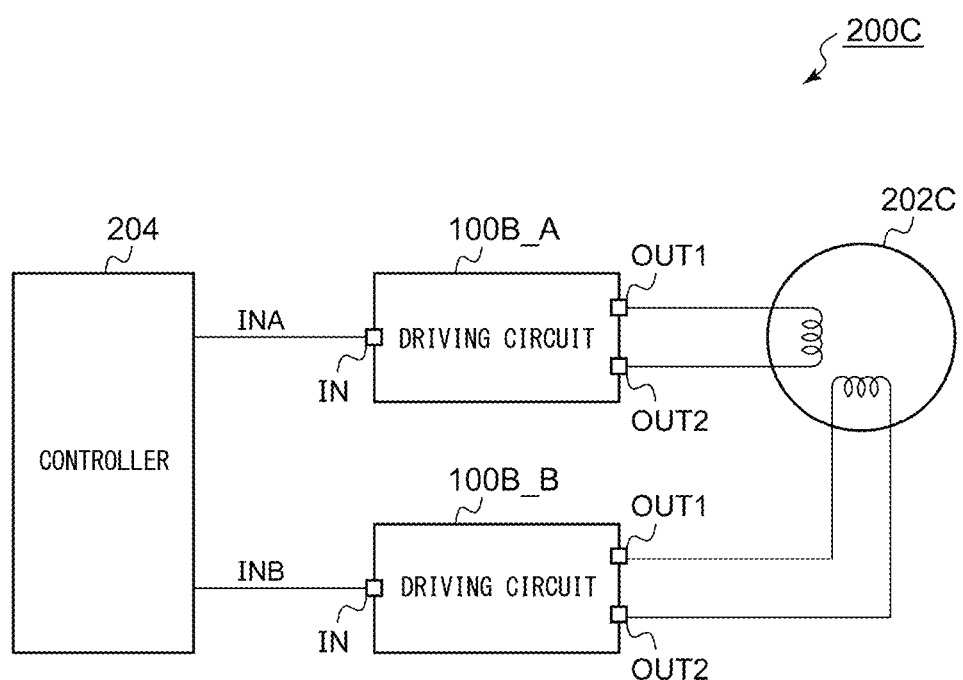
FIG. 8 is a circuit diagram showing a system according to a fourth example.

The driving circuit 100B shown in FIG. 6 can be used to drive a stepping motor. FIG. 8 is a circuit diagram showing a system 200C according to a fourth example. The system 200C includes two driving circuits 100B shown in FIG. 6. The output of one driving circuit 100B_A is coupled to one coil of a stepping motor 202C. The output of the other driving circuit 100B_B is coupled to the other coil of the stepping motor 202C. The controller 204 supplies a control input signal INA to the driving circuit 100B_A, and supplies a control input signal INB to the driving circuit 100B_B, so as to control the stepping motor 202C. The waveforms of the control input signals INA and INB are selected according to the stepping motor driving method (1-phase excitation, ½-phase excitation, 2-phase excitation, etc.).

Fifth Example

Figure 9:
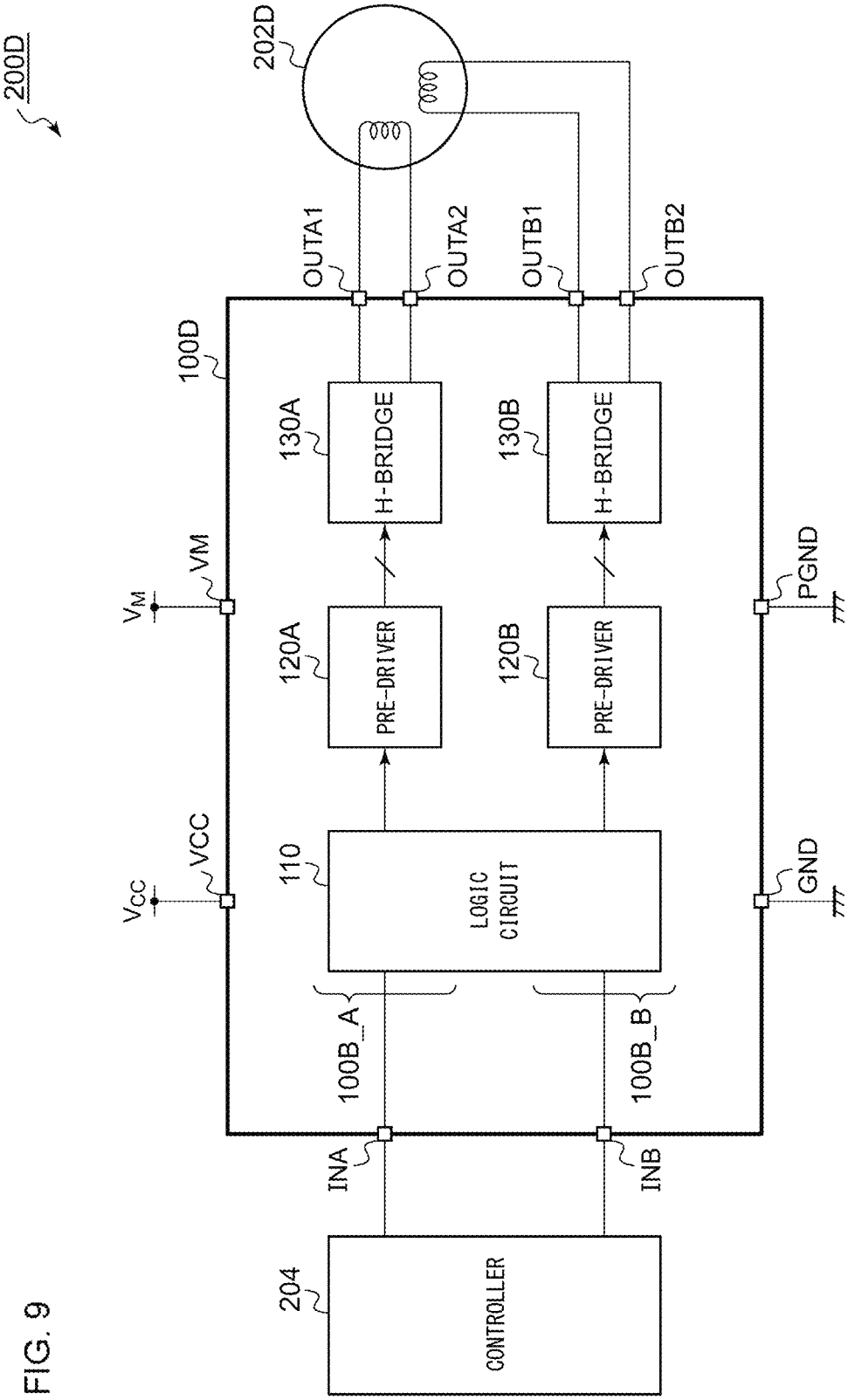
FIG. 9 is a circuit diagram showing a system including a driving circuit according to a fifth example.
Figure 10:
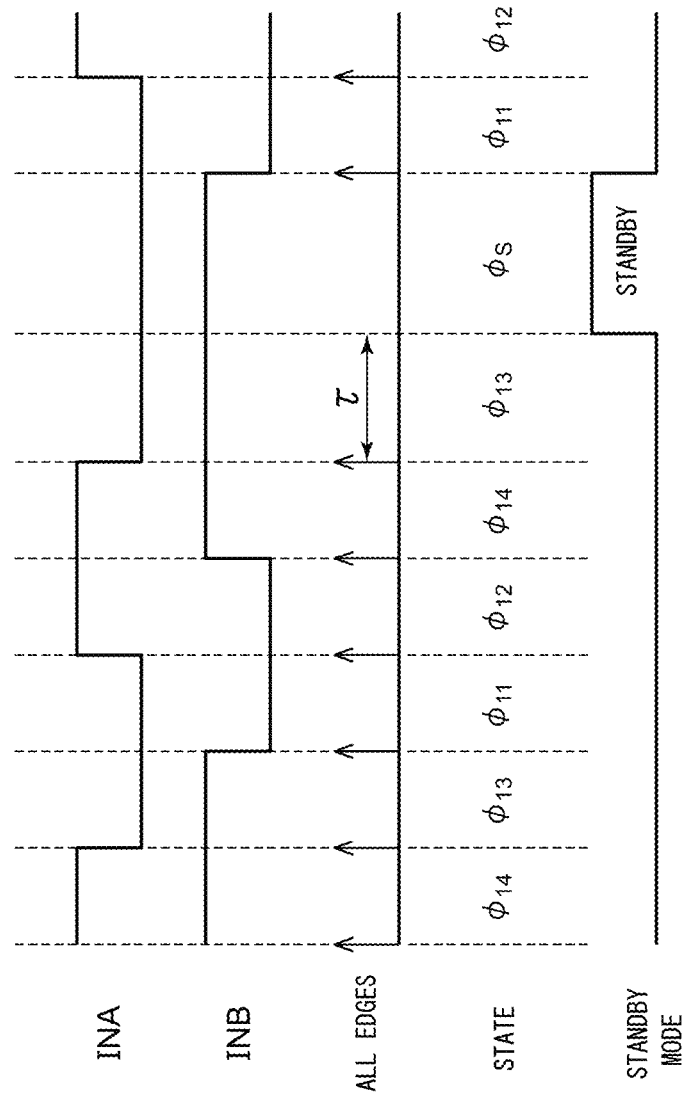
FIG. 10 is a time chart showing an example of the operation of the system shown in FIG. 9.

FIG. 9 is a circuit diagram showing a system 200D including a driving circuit 100D according to a fifth example. The driving circuit 100D can be regarded as a circuit designed by integrating the driving circuits 100B_A and 100B_B shown in FIG. 8. The outputs OUTA and OUTB can be set to one from among four states $\phi_{11}$ through $\phi_{14}$ according to a combination of INA and INB.
$\phi_{11}$ INA=L, INB=L
OUTA1=L, OUTA2=H, OUTB1=L, OUTB2=H
$\phi_{12}$ INA=H, INB=L
OUTA1=H, OUTA2=L, OUTB1=L, OUTB2=H
$\phi_{13}$ INA=L, INB=H
OUTA1=L, OUTA2=H, OUTB1=H, OUTB2=L
$\phi_{14}$ INA=H, INB=H
OUTA1=H, OUTA2=L, OUTB1=H, OUTB2=L FIG. 10 is a time chart showing an example of the operation of the system 200D shown in FIG. 9. Description will be made below regarding an example employing 1-2 phase excitation. The standby circuit 160 of the driving circuit 100D monitors all the edges of the two control input signals INA and INB. When the edge interval exceeds a predetermined judgment period of time τ, the mode is switched to the standby mode. In other words, at least one from among the four states $\phi_{11}$ through $\phi_{14}$ continues for the predetermined period of time, the mode is switched to the standby mode. During the standby mode, the bridge circuits 130A and 130B are fixed to a predetermined state $\phi$s (e.g., the high-impedance state or the short brake state). Alternatively, as the predetermined state $\phi$s, the immediately previous state ($\phi_{13}$ in the example shown in FIG. 10) may be employed.

In the standby mode, upon detecting the next edge, the standby mode is released. Subsequently, the operation state transits in order of the states $\phi_{11}$ and $\phi_{12}$ according to the two control inputs INA and INB.

Description has been made above regarding the present invention with reference to the embodiments. The embodiments have been described for exemplary purposes only, and are by no means intended to be interpreted restrictively. Rather, various modifications may be made by making various combinations of the aforementioned components or processes. Description will be made below regarding such modifications.

Modification 1

Description has been made in the embodiments regarding an arrangement in which the high-impedance state $\phi_1$ is employed as a trigger for switching to the standby mode. However, the present invention is not restricted to such an arrangement. Also, the short brake state $\phi_4$ may be employed as a trigger for switching to the standby mode. That is to say, when the control input signal (INA=INB=H) for indicating the short brake state $\phi_4$ continues for a judgment period of time $\tau$, the operation mode may be switched to the standby mode.

Modification 2

Description has been made in the embodiments regarding an arrangement in which a single-phase DC motor is employed as a load. However, the present invention is not restricted to such an arrangement. Also, the present invention is applicable to a driving circuit for a three-phase inverter or a stepping motor.

Modification 3

The load is not restricted to such a motor. Also, the driving circuit 100 may be configured as a part of a flyback converter, forward converter, DC/DC converter, or the like.

Modification 4

Figure 11:
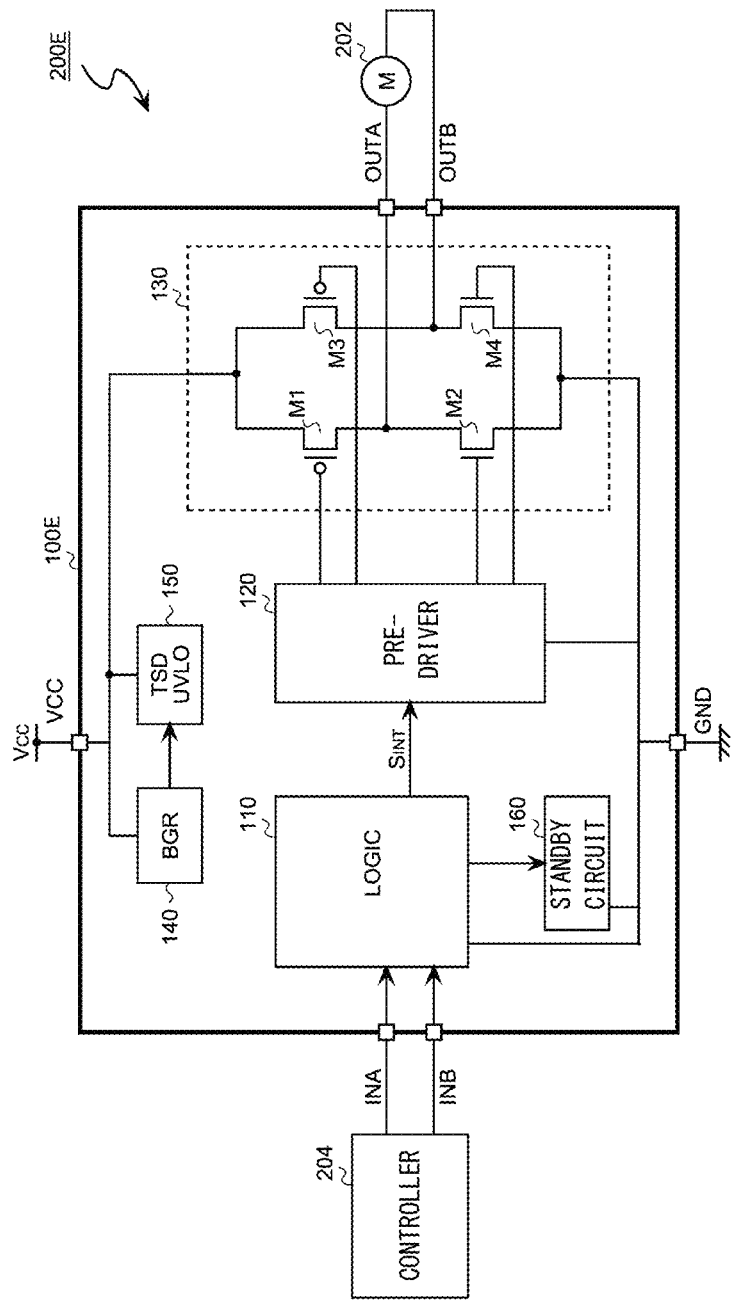
FIG. 11 is a circuit diagram showing a driving circuit according to a modification 4.

Description has been made in the embodiments regarding an arrangement in which the power supply and the ground of the H-bridge circuit 130 are configured such that they are separate from the power supply and the ground for the logic circuit 110 or the pre-driver 120. Also, the power supply and the ground may be shared. FIG. 11 is a circuit diagram showing a driving circuit 100E according to a modification 4. The driving circuit 100E is configured as a modification of the driving circuit 100 shown in FIG. 2, such that it includes a shared power supply pin and a shared ground pin instead of the two power supply pins and the two ground pins.

Figure 12:
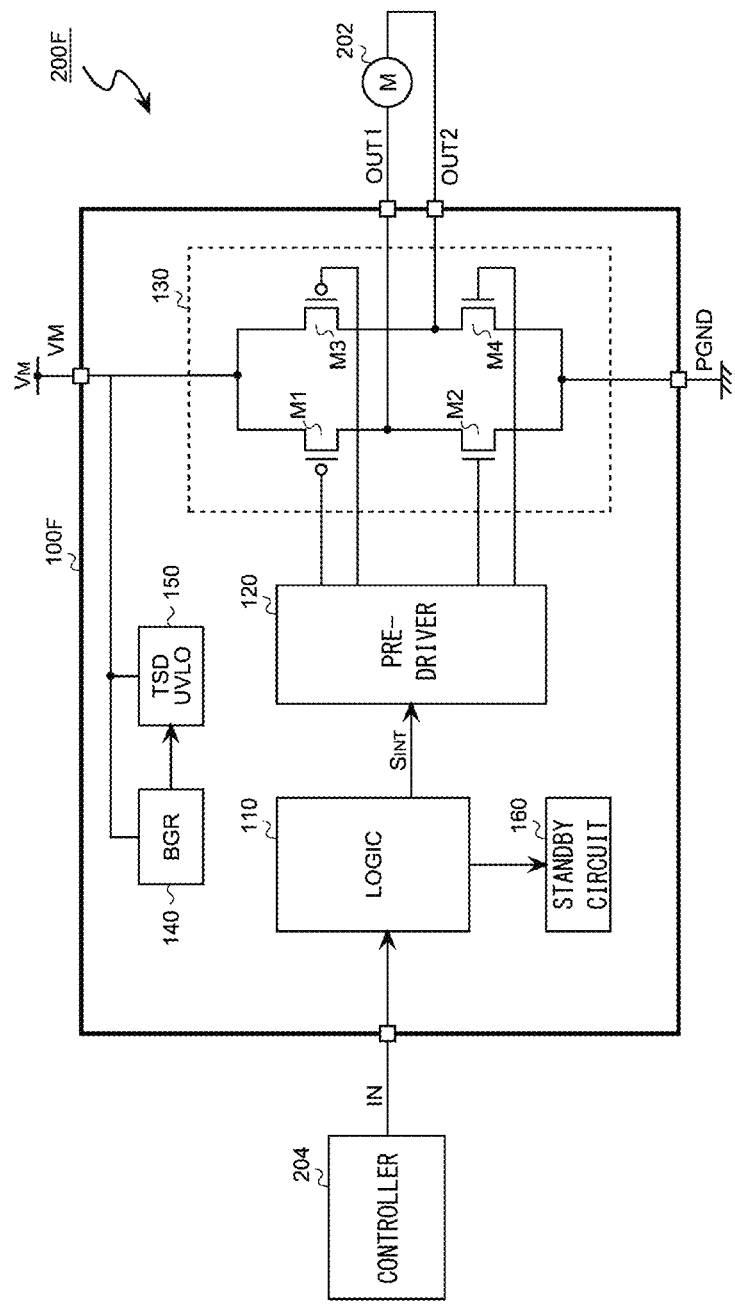
FIG. 12 is a circuit diagram showing a driving circuit according to the modification 4.

FIG. 12 is a circuit diagram showing a driving circuit 100F according to the modification 4. The driving circuit 100F is configured as a modification of the driving circuit 100B shown in FIG. 6, such that it includes a shared power supply pin and a shared ground pin instead of the two power supply pins and the two ground pins.

Modification 5

Figure 13:
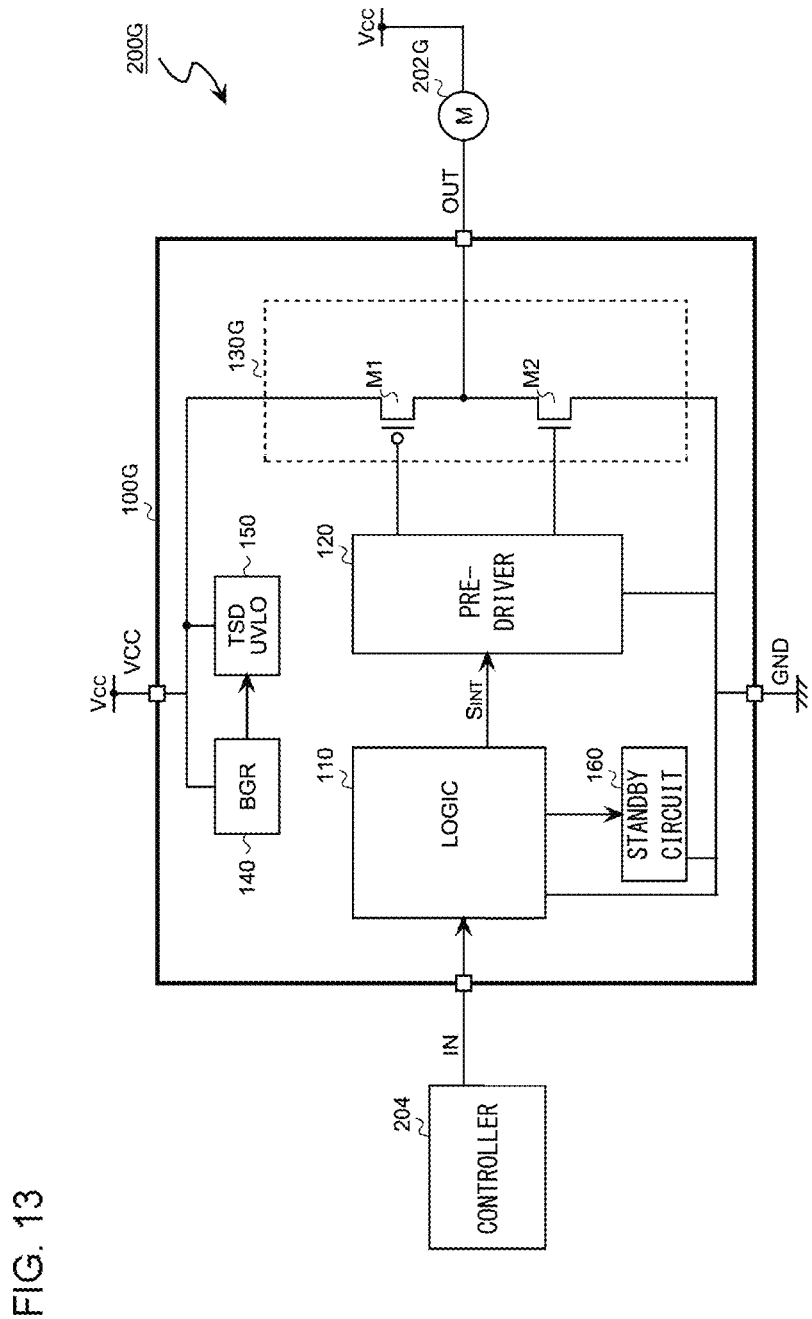
FIG. 13 is a circuit diagram showing a system including a driving circuit according to a modification 5.

FIG. 13 is a circuit diagram showing a system 200G including a driving circuit 100G according to a modification 5. The driving circuit 100G includes a half-bridge circuit 130G instead of the H-bridge circuit 130. Furthermore, the driving circuit 100G includes a single control input pin IN. The output pin of the half-bridge circuit 130G is coupled to one end of a motor 202G (coil). A predetermined voltage (power supply voltage or ground voltage) is applied to the other end of the motor 202G.

Figure 14A:
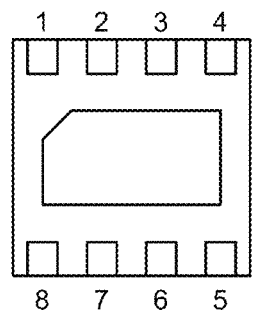
FIG. 14A through FIG. 14H are external views each showing a package of a driving circuit.

Lastly, description will be made regarding an example of a package of the driving circuit 100. FIG. 14A through FIG. 14H are external views each showing a package of the driving circuit 100. FIG. 14A shows an 8-pin package. For example, the driving circuit 100 shown in FIG. 2 can be housed in this package. The respective pins of the driving circuit 100 shown in FIG. 2 may be arranged as follows

| Name | Pin number |
|------|------------|
| VM   | 2          |
| PGND | 8          |
| VCC  | 4          |
| GND  | 5          |
| INA  | 3          |
| INB  | 6          |
| OUTA | 1          |
| OUTB | 7          |

Figure 14B:
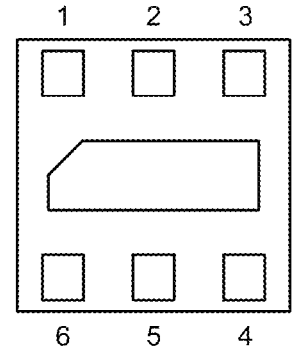

FIG. 14B shows a 6-pin package. For example, the driving circuit 100E shown in FIG. 11 can be housed in this package. The respective pins of the driving circuit 100E shown in FIG. 11 may be arranged as follows.

| Name | Pin number |
|------|------------|
| VCC  | 2          |
| GND  | 5          |
| INA  | 3          |
| INB  | 4          |
| OUTA | 1          |
| OUTB | 6          |

Figure 14C:
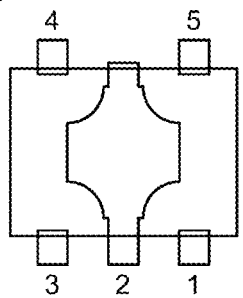

FIG. 14C shows a 5-pin package. For example, the driving circuit 100F shown in FIG. 12 can be housed in this package. The respective pins of the driving circuit 100F may be arranged as follows.

| Name | Pin number |
|------|------------|
| VM   | 5          |
| PGND | 2          |
| IN   | 4          |
| OUTA | 1          |
| OUTB | 3          |

Figure 14D:
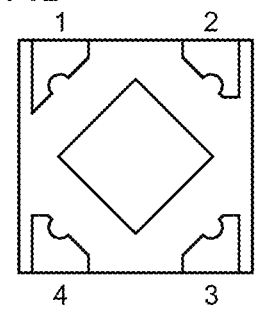

FIG. 14D shows a 4-pin package. For example, the driving circuit 100G shown in FIG. 13 can be housed in this package. The respective pins of the driving circuit 100G may be arranged as follows.

| Name | Pin number |
|------|------------|
| VCC  | 1          |
| GND  | 2          |
| IN   | 3          |
| OUT  | 4          |

Figure 14E:
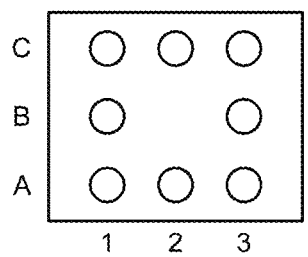
Figure 14F:
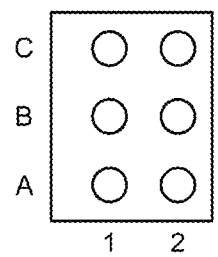
Figure 14G:
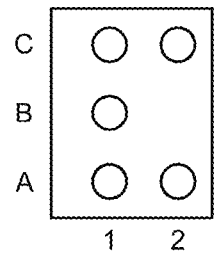
Figure 14H:
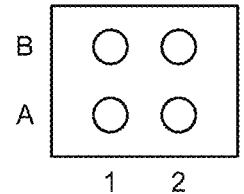

FIG. 14E through FIG. 14F shows an 8-pin CSP (Chip Size Package), a 6-pin CSP, a 5-pin CSP, and a 4-pin CSP, respectively.

While the preferred embodiments of the present invention have been described using specific terms, such description is for illustrative purposes only, and it is to be understood that changes and variations may be made without departing from the spirit or scope of the appended claims.

What is claimed is:
1. A driving circuit structured to drive a load, comprising:
   a bridge circuit including transistors;
   a single control input pin to be coupled to receive a single control input signal indicative of a state of the bridge circuit from an external circuit;
   a logic circuit structured to generate an internal signal indicative of a state of the transistors of the bridge circuit according to the single control input signal; and a pre-driver structured to drive the bridge circuit according to the internal signal, wherein the driving circuit is structured to be switched to a standby mode when the single control input signal continues in a predetermined state for a predetermined judgment period of time, wherein the predetermined state corresponds to a short brake state of the bridge circuit.

2. The driving circuit according to claim 1, wherein the judgment period of time is longer than 50 µs.

3. The driving circuit according to claim 1, wherein the load is structured as a motor.

4. A system comprising:
a processor;
a motor; and
the driving circuit according to claim 1, structured to drive the motor according to one or two control input signals received from the processor,
wherein, when the driving circuit is to be switched to the standby mode, the processor fixedly sets the one or two control input signals to a predetermined state for a predetermined period of time or more.

5. A driving circuit structured to drive a load, comprising:
a bridge circuit including transistors;
two control input pins to be coupled to receive two control input signals indicative of a state of the bridge circuit from an external circuit;
a logic circuit structured to generate an internal signal indicative of a state of the transistor of the bridge circuit according to the two control input signals;
a pre-driver structured to drive the bridge circuit according to the internal signal,
wherein the driving circuit is structured to be switched to a standby mode when the two control input signals continue in a predetermined state for a predetermined judgment period of time, wherein the predetermined state corresponds to a short brake state of the bridge circuit.

6. The driving circuit according to claim 5, wherein the judgment period of time is longer than 50 µs.

7. The driving circuit according to claim 5, wherein the load is structured as a motor.

8. A system comprising:
a processor;
a motor; and
the driving circuit according to claim 6, structured to drive the motor according to one or two control input signals received from the processor,
wherein, when the driving circuit is to be switched to the standby mode, the processor fixedly sets the one or two control input signals to a predetermined state for a predetermined period of time or more.

9. A control method for a driving circuit comprising a bridge circuit to be coupled to a motor, the control method comprising:
switching one or two control input signals for setting a state of the bridge circuit, with an interval that is shorter than a predetermined period, in order to rotationally drive the motor;
controlling the bridge circuit according to the one or two control input signals;
fixedly setting, by a processor, the one or two control input signals for a predetermined period of time in order to switch the driving circuit to a standby mode; and
switching the driving circuit to the standby mode when the driving circuit detects that the one or two control input signals continue in the predetermined state for the predetermined period of time, wherein the predetermined state corresponds to a short brake state of the bridge circuit.

* * * * *